US011031245B2

(12) United States Patent
Smith et al.

(10) Patent No.: US 11,031,245 B2
(45) Date of Patent: Jun. 8, 2021

(54) TIN OXIDE THIN FILM SPACERS IN SEMICONDUCTOR DEVICE MANUFACTURING

(71) Applicant: Lam Research Corporation, Fremont, CA (US)

(72) Inventors: David Charles Smith, Lake Oswego, OR (US); Richard Wise, Los Gatos, CA (US); Arpan Mahorowala, West Linn, OR (US); Patrick A. Van Cleemput, San Jose, CA (US); Bart J. van Schravendijk, Palo Alto, CA (US)

(73) Assignee: Lan Research Corporation, Fremont, CA (US)

( * ) Notice: Subject to any disclaimer, the term of this patent is extended or adjusted under 35 U.S.C. 154(b) by 284 days.

(21) Appl. No.: 15/713,377

(22) Filed: Sep. 22, 2017

(65) Prior Publication Data

US 2018/0012759 A1    Jan. 11, 2018

Related U.S. Application Data

(63) Continuation of application No. 15/195,348, filed on Jun. 28, 2016, now Pat. No. 9,824,893.

(Continued)

(51) Int. Cl.
*H01L 21/033* (2006.01)
*H01L 21/02* (2006.01)
(Continued)

(52) U.S. Cl.
CPC ........ *H01L 21/0332* (2013.01); *C23C 16/407* (2013.01); *C23C 16/45542* (2013.01);
(Continued)

(58) Field of Classification Search
CPC ........... H01L 21/0332; H01L 21/32137; H01L 21/31144; H01L 21/32139;
(Continued)

(56) References Cited

U.S. PATENT DOCUMENTS 4,708,766 A    11/1987 Hynecek
4,778,562 A    10/1988 Chang
(Continued)

FOREIGN PATENT DOCUMENTS

CN    104752199 A    7/2015
JP    62179774 A  *  8/1987
(Continued)

OTHER PUBLICATIONS

Machine translation of JP 62179774 (Year: 1987).*

(Continued)

*Primary Examiner* — Nadine G Norton
*Assistant Examiner* — Mahmoud Dahimene
(74) *Attorney, Agent, or Firm* — Weaver Austin Villeneuve & Sampson LLP

(57) ABSTRACT

Thin tin oxide films are used as spacers in semiconductor device manufacturing. In one implementation, thin tin oxide film is conformally deposited onto a semiconductor substrate having an exposed layer of a first material (e.g., silicon oxide or silicon nitride) and a plurality of protruding features comprising a second material (e.g., silicon or carbon). For example, 10-100 nm thick tin oxide layer can be deposited using atomic layer deposition. Next, tin oxide film is removed from horizontal surfaces, without being completely removed from the sidewalls of the protruding features. Next, the material of protruding features is etched away, leaving tin oxide spacers on the substrate. This is followed by etching the unprotected portions of the first material, without removal of the spacers. Next, underlying layer is etched, and (Continued)

spacers are removed. Tin-containing particles can be removed from processing chambers by converting them to volatile tin hydride.

18 Claims, 7 Drawing Sheets

Related U.S. Application Data

(60) Provisional application No. 62/458,464, filed on Feb. 13, 2017, provisional application No. 62/460,573, filed on Feb. 17, 2017, provisional application No. 62/479,709, filed on Mar. 31, 2017.

(51) Int. Cl.
| | |
|---|---|
| *H01L 21/027* | (2006.01) |
| *H01L 21/67* | (2006.01) |
| *H01L 21/311* | (2006.01) |
| *H01L 21/3213* | (2006.01) |
| *C23C 16/455* | (2006.01) |
| *C23C 16/40* | (2006.01) |
| *H01J 37/32* | (2006.01) |
| *C23C 16/56* | (2006.01) |

(52) U.S. Cl.
CPC ........ *C23C 16/45553* (2013.01); *C23C 16/56* (2013.01); *H01J 37/32091* (2013.01); *H01L 21/0228* (2013.01); *H01L 21/0271* (2013.01); *H01L 21/02175* (2013.01); *H01L 21/02274* (2013.01); *H01L 21/0337* (2013.01); *H01L 21/31111* (2013.01); *H01L 21/31122* (2013.01); *H01L 21/31144* (2013.01); *H01L 21/32137* (2013.01); *H01L 21/32139* (2013.01); *H01L 21/67069* (2013.01); *H01J 37/32862* (2013.01); *H01J 2237/3321* (2013.01); *H01J 2237/3341* (2013.01); *H01J 2237/3342* (2013.01)

(58) Field of Classification Search
CPC ......... H01L 21/67069; H01L 21/31122; H01L 21/31111; H01L 21/0337; H01L 21/0271; H01L 21/0228; H01L 21/02274; H01L 21/02175; C23C 16/56; C23C 16/407; C23C 16/45553; C23C 16/45542; H01J 37/32091; H01J 2237/3342; H01J 2237/3341; H01J 2237/3321; H01J 37/32862
See application file for complete search history.

(56) References Cited

U.S. PATENT DOCUMENTS

| | | |
|---|---|---|
| 5,032,221 A | 7/1991 | Roselle et al. |
| 5,171,401 A | 12/1992 | Roselle |
| 5,286,337 A | 2/1994 | Tsou |
| 5,318,664 A | 6/1994 | Saia et al. |
| 5,607,602 A | 3/1997 | Su et al. |
| 5,667,631 A | 9/1997 | Holland et al. |
| 5,723,366 A | 3/1998 | Suzuki et al. |
| 6,036,876 A | 3/2000 | Chen et al. |
| 6,368,978 B1 | 4/2002 | Kumar et al. |
| 6,416,822 B1 | 7/2002 | Chiang et al. |
| 6,428,859 B1 | 8/2002 | Chiang et al. |
| 7,459,732 B2 | 12/2008 | Fleischer et al. |
| 8,163,094 B1 | 4/2012 | Greer et al. |
| 8,435,608 B1 | 5/2013 | Subramonium et al. |
| 8,747,964 B2 | 6/2014 | Park et al. |
| 8,969,110 B2 | 3/2015 | Choi |
| 9,287,113 B2 | 3/2016 | Kang et al. |
| 9,437,443 B2 | 9/2016 | Brink et al. |
| 9,515,156 B2 | 12/2016 | Besser et al. |
| 9,523,148 B1 | 12/2016 | Pore et al. |
| 9,824,893 B1 | 11/2017 | Smith et al. |
| 9,892,917 B2 | 2/2018 | Swaminathan et al. |
| 10,546,748 B2 | 1/2020 | Yu et al. |
| 2001/0030860 A1 | 10/2001 | Kimura et al. |
| 2002/0044230 A1 | 4/2002 | Yamazaki et al. |
| 2002/0134425 A1 | 9/2002 | Yamamoto et al. |
| 2006/0072084 A1 | 4/2006 | Van Herpen et al. |
| 2006/0073706 A1* | 4/2006 | Li ................... H01L 21/31116 438/710 |
| 2006/0148118 A1 | 7/2006 | Hsiung et al. |
| 2006/0175558 A1 | 8/2006 | Bakker et al. |
| 2006/0270209 A1 | 11/2006 | Mitsui et al. |
| 2007/0040999 A1 | 2/2007 | Wilhelmus Van Herpen et al. |
| 2007/0069160 A1 | 3/2007 | Banine et al. |
| 2008/0061030 A1 | 3/2008 | Liu et al. |
| 2009/0011589 A1 | 1/2009 | Jeon et al. |
| 2009/0017616 A1* | 1/2009 | Grunow ............ H01L 21/31144 438/656 |
| 2009/0145879 A1 | 6/2009 | Fairbairn et al. |
| 2009/0233425 A1 | 9/2009 | Furuno et al. |
| 2010/0120247 A1 | 5/2010 | Park |
| 2010/0159639 A1 | 6/2010 | Sakata |
| 2010/0195033 A1* | 8/2010 | Takayama ........... H01L 27/1214 349/122 |
| 2011/0198627 A1 | 8/2011 | Maindron et al. |
| 2011/0306214 A1 | 12/2011 | Zin |
| 2013/0161625 A1 | 6/2013 | Ku et al. |
| 2013/0309871 A1 | 11/2013 | DeVilliers |
| 2014/0308812 A1 | 10/2014 | Arghavani et al. |
| 2015/0000737 A1 | 1/2015 | Miyake et al. |
| 2015/0140726 A1 | 5/2015 | Honda et al. |
| 2015/0221541 A1 | 8/2015 | Nemani et al. |
| 2015/0243661 A1 | 8/2015 | Matsumoto |
| 2015/0247238 A1 | 9/2015 | Pasquale et al. |
| 2015/0287612 A1 | 10/2015 | Luere et al. |
| 2015/0318181 A1 | 11/2015 | Cantone et al. |
| 2016/0111374 A1 | 4/2016 | Brink et al. |
| 2016/0203982 A1 | 7/2016 | Lin et al. |
| 2016/0293438 A1 | 10/2016 | Zhou et al. |
| 2016/0314985 A1 | 10/2016 | Yang et al. |
| 2016/0336178 A1 | 11/2016 | Swaminathan et al. |
| 2017/0301552 A1 | 10/2017 | de Villiers |
| 2018/0240667 A1 | 2/2018 | Yu et al. |
| 2018/0233398 A1 | 8/2018 | van Cleemput et al. |
| 2018/0277661 A1 | 9/2018 | Nagayama et al. |
| 2019/0157084 A1 | 5/2019 | Huang et al. |
| 2019/0237341 A1 | 8/2019 | Yu et al. |
| 2020/0006082 A1 | 1/2020 | Su |
| 2020/0051807 A1 | 2/2020 | Singhal et al. |
| 2020/0083044 A1 | 3/2020 | Yu et al. |
| 2020/0219725 A1 | 7/2020 | Smith et al. |
| 2020/0219758 A1 | 7/2020 | van Cleemput et al. |
| 2021/0017643 A1 | 1/2021 | Kanakasabapathy et al. |

FOREIGN PATENT DOCUMENTS

| | | |
|---|---|---|
| JP | 2007208076 A * | 8/2007 |
| KR | 10-2017-0141673 A | 12/2017 |

OTHER PUBLICATIONS

U.S. Office Action, dated Sep. 13, 2019, issued in U.S. Appl. No. 15/893,458.
U.S. Office Action, dated Apr. 11, 2019, issued in U.S. Appl. No. 15/894,635.
U.S. Notice of Allowance, dated Aug. 21, 2019, issued in U.S. Appl. No. 15/894,635.
International Search Report and Written Opinion dated Jun. 27, 2018 issued in Application No. PCT/US18/18019.
International Preliminary Report on Patentability dated Aug. 29, 2019 issued in Application No. PCT/US2018/018019.
International Search Report and Written Opinion dated May 17, 2019 issued in Application No. PCT/US2019/015559.

(56) References Cited

OTHER PUBLICATIONS

U.S. Preliminary Amendment, filed Mar. 3, 2014 in U.S. Appl. No. 14/195,653.
Choi, W.-S., (Dec. 25, 2009) "The Fabrication of Tin Oxide Films by Atomic Layer Deposition using Tetrakis(Ethylmethylamino) Tin Precursor," *Transactions on Electrical and Electronic Materials*, 10(6):200-202.
Du, X. et al., (Jul./Aug. 2005) "In situ examination of tin oxide atomic layer deposition using quartz crystal microbalance and Fourier transform infrared techniques," *J. Vac. Sci. Technol. A*, 23(4):581-588.
Elam, J.W., et al, (2008) "Atomic Layer Deposition of Indium Tin Oxide Thin Films Using Nonhalogenated Precursors," *J. Phys. Chem. C*, 112(6):1938-1945.
Elam, J.W., et al, (Mar./Apr. 2008) "Atomic layer deposition of tin oxide films using tetrakis(dimethylamino) tin," *J. Vac. Sci. Technol. A*, 26(2):244-252.
Heo, J., et al., (2010) "Low Temperature Atomic Layer Deposition of Tin Oxide," *Chemistry of Materials*, 22(17):4964-4973.
Heo, J., et al., (2012) "Atomic layer deposition of tin oxide with nitric oxide as an oxidant gas," *J. Mater. Chem.*, 22:4599-4602.
Kwon, K.H., et al., (Mar./Apr. 2010) "Etch mechanism of $In_2O_3$ and $SnO_2$ thin films in HBr-based inductively coupled plasmas," *J. Vac. Sci. Technol. A* 28(2):226-231.
Li, X., et al., (2012) "Tin Oxide with Controlled Morphology and Crystallinity by Atomic Layer Deposition onto Graphene Nanosheets for Enhanced Lithium Storage," *Advanced Function Materials*, 22:1647-1654.
Mohri et al., (Oct. 1990) "Plasma Etching of ITO Thin Films Using a $CH_4/H_2$ Gas Mixture," *Japanese Journal of Applied Physics*, 29(10) : L1932-L1935.
Mullings, M.N., et al., (Nov./Dec. 2013) "Tin oxide atomic layer deposition from tetrakis(dimethylamino)tin and water," *J. Vac. Sci. Technol. A*, 31(6):061503-1-061503-8.
Wolf, S. and Tauber, R.N. (1986) "Silicon Processing for the VLSI Era," *Process Technology*, vol. 1, Lattice Press, pp. 545-547.
Wu, B.-R., et al., (2014) "Texture-Etched $SnO_2$ Glasses Applied to Silicon Thin-Film Solar Cells," *Journal of Nanomaterials*, vol. 2014, Article ID 907610, 9 pages.
U.S. Appl. No. 15/195,348, filed Jun. 28, 2016, Smith et al.
U.S. Office Action, dated Feb. 9, 2017, issued in U.S. Appl. No. 15/195,348.
U.S. Notice of Allowance, dated Jun. 26, 2017, issued in U.S. Appl. No. 15/195,348.
U.S. Final Office Action, dated Mar. 19, 2020, issued in U.S. Appl. No. 15/893,458.
Chinese First Office Action dated Jan. 6, 2020 issued in Application No. CN 201710498301.5.
U.S. Appl. No. 16/825,473, filed Mar. 20, 2020, Cleemput et al.
U.S. Appl. No. 16/825,514, filed Mar. 20, 2020, Smith et al.
U.S. Office Action, dated Jun. 25, 2020, issued in U.S. Appl. No. 16/260,764.
Chinese Second Office Action dated Jun. 15, 2020 issued in Application No. CN 201710498301.5.
RD 301101A, May 10, 1989, RD.
U.S. Office Action, dated Aug. 3, 2020, issued in U.S. Appl. No. 15/893,458.
U.S. Final Office Action, dated Dec. 7, 2020 issued in U.S. Appl. No. 16/260,764.
Taiwanese First Office Action dated Dec. 2, 2020 issued in Application No. TW 106121182.
International Search Report and Written Opinion (ISA/KR) dated Jul. 3, 2019 issued in Application No. PCT/US2019/022319.
International Preliminary Report and Patentability (ISA/KR) dated Oct. 1, 2020 issued in Application No. PCT/US2019/022319.
International Preliminary Report on Patentability dated Aug. 13, 2020 issued in Application No. PCT/US2019/015559.
Gordon, et al., (1992) "Low-Temperature Atmospheric Pressure Chemical Vapor Deposition of Polycrystalline Tin Nitride Thin Films" *Chem. Mater.* 1992, 4, pp. 68-71.
U.S. Appl. No. 16/982,489, filed Sep. 18, 2020, Kanakasabapathy et al.
U.S. Final Office Action, dated Dec. 15, 2020, issued in U.S. Appl. No. 15/893,458.
U.S. Office Action, dated Mar. 30, 2021, issued in U.S. Appl. No. 16/687,142.
U.S. Notice of Allowance, dated Apr. 2, 2021, issued in U.S. Appl. No. 15/893,458.

\* cited by examiner

TIN OXIDE THIN FILM SPACERS IN SEMICONDUCTOR DEVICE MANUFACTURING

CROSS-REFERENCE TO RELATED APPLICATIONS

This application is a continuation application of U.S. patent application Ser. No. 15/195,348, titled "TIN OXIDE THIN FILM SPACERS IN SEMICONDUCTOR DEVICE MANUFACTURING", filed on Jun. 28, 2016, and naming Smith et al. as inventors, which is hereby incorporated by reference in its entirety. This application also claims priority to U.S. Provisional Application Ser. No. 62/458,464, titled "METHOD TO CREATE AIR GAPS", filed on Feb. 13, 2017, and naming Van Cleemput et al. as inventors; to U.S. Provisional Application Ser. No. 62/460,573, titled TIN OXIDE FILMS IN SEMICONDUCTOR DEVICE MANUFACTURING, filed on Feb. 17, 2017, and naming Tan et al. as inventors; and to U.S. Provisional Application Ser. No. 62/479,709, titled TIN OXIDE FILMS IN SEMICONDUCTOR DEVICE MANUFACTURING, filed on Mar. 31, 2017, naming Tan et al. as inventors. All of these applications are herein incorporated by reference in their entirety.

FIELD OF THE INVENTION

This invention pertains to patterning methods in semiconductor device manufacturing. Specifically, this invention pertains to methods of using thin tin oxide films as spacers in semiconductor processing.

BACKGROUND

In integrated circuit (IC) fabrication, deposition and etching techniques are used for forming patterns of materials, such as for forming metal lines embedded in dielectric layers. Some patterning schemes involve the use of spacers that enable precise patterning and formation of small-scale features. Spacers are formed on a substrate, such that they are separated by defined distances (typically determined by previous patterning), and are used as masks for patterning of underlying layers. The materials of spacers and of surrounding layers are selected to have appropriate etch selectivity that would enable both formation of spacers, and patterning of underlying layers. After the patterning is completed, the spacers are removed by etching, and are not part of the final fabricated semiconductor device.

Spacers are used for patterning in a variety of applications, including formation of dynamic random-access memory (DRAM), patterning fins in fin field effect transistors (finFETs), and in back end of line (BEOL) processing.

SUMMARY

It was discovered that many spacer materials, such as silicon oxide, or titanium oxide, give rise to pitch walking and/or particle contamination problems during patterning. For example, silicon oxide is characterized by relatively low etch selectivity relative to many materials commonly used in semiconductor processing, which necessitates the use of thicker spacers. This, in turn, leads to inconsistent lateral spacer sidewall consumption across the way, and ultimately might result in pitch walking (inconsistent distance between spacers). When titanium oxide is used as a spacer material, etch selectivity can be adequate, but titanium-containing particles may contaminate process chambers. For example, titanium fluoride particles can contaminate etching chambers after fluorocarbon plasma etch. This leads to the necessity of frequent etching chamber cleaning and to decreased productivity.

These problems are herein addressed by using tin oxide as spacer material. Tin oxide has a high modulus, which correlates with good etch selectivity that is needed to reduce pitch walking and edge roughness. Furthermore, unlike titanium, tin forms a highly volatile hydride, which can be easily removed from the process chambers. Thus, in some embodiments provided processing methods involve converting any tin-containing materials (such as tin fluoride) to tin hydride (e.g., by plasma treatment in a hydrogen-containing process gas), and removing the formed volatile tin hydride from the process chamber via purging and/or evacuation. The cleaning process that removes tin-containing particles from chamber interior can be performed in etch or deposition chambers, typically in an absence of the substrate.

In one aspect of the invention, a method of processing a semiconductor substrate is provided. The method includes: providing a semiconductor substrate having an exposed layer comprising a first material and at least one protruding feature comprising a second material that is different from the first material; and depositing a SnO layer over both the first material and the second material, including sidewalls of the at least one protruding feature. The first material and the second material are selected such that a ratio of an etch rate of the first material to an etch rate of SnO is greater than 1 for a first etch chemistry, and a ratio of an etch rate of the second material to an etch rate of SnO is greater than 1 for a second etch chemistry. For example, in some embodiments the first material is silicon oxide and/or silicon nitride, and the first etch chemistry is a fluorocarbon plasma etch. The second material, in some embodiments, comprises amorphous silicon and/or carbon, and the second etch chemistry is an oxidative oxygen-containing chemistry (e.g., plasma treatment in a process gas comprising HBr and $O_2$).

In some implementations, the substrate comprises a plurality of protruding features, and the distance between closest protruding features before deposition of SnO is between about 10-100 nm. In some implementations the distance between closest protruding features is between about 40-100 nm. In other implementations, the distance between closest protruding features is between about 10-30 nm. In some embodiments the SnO layer is deposited conformally, e.g., by atomic layer deposition (ALD) to a thickness of between about 5-30 nm, such as to a thickness of between about 10-20 nm.

After the SnO layer has been deposited, spacers are formed from the SnO layer. In some embodiments formation of spacers involves: after depositing the SnO layer, completely removing the SnO layer from horizontal surfaces of the semiconductor substrate without completely removing the SnO layer covering the sidewalls of the at least one protrusion. This is followed by completely removing the at least one protrusion using the second etch chemistry, without completely removing the SnO layer that was covering the sidewalls of the at least one protrusion, thereby forming SnO spacers.

After the SnO spacers have been formed, the process can continue by removing exposed portions of the first material using the first etch chemistry (e.g., using plasma fluorocarbon etch), without completely removing the SnO spacers, thereby exposing portions of a hardmask layer, underlying the first material layer. The process may follow by removing both the SnO layer and exposed portions of the hardmask layer without completely removing the layer of the first material that resided below the SnO layer.

The semiconductor processing methods, provided herein, in some embodiments involve converting tin-containing particles remaining in the process chamber to tin hydride after any of the deposition and etching operations provided herein. This conversion is performed by exposing the process chamber to a plasma formed in a process gas comprising a hydrogen-containing gas. In some embodiments the hydrogen-containing gas is $H_2$ and/or $NH_3$. In some embodiments, the etching chamber is cleaned after fluorocarbon plasma etch by converting the tin-containing particles (e.g., tin fluoride) to tin hydride, and by removing volatile tin hydride from the etch chamber.

In some embodiments, the methods provided herein are used in combination with photolithographic processing and include: applying photoresist to the semiconductor substrate; exposing the photoresist to light; patterning the photoresist and transferring the pattern to the semiconductor substrate; and selectively removing the photoresist from the semiconductor substrate. For example, lithography can be used to form a pattern of protruding features before deposition of SnO layer on the substrate.

In another aspect, a partially fabricated semiconductor device is provided, wherein the device comprises an exposed layer of a first material (e.g., silicon oxide or silicon nitride) and a plurality of SnO spacers residing on the layer of the first material. In some embodiments, the distance between the spacers is between about 5-90 nm.

According to another aspect, an apparatus for deposition of SnO layer is provided. The apparatus includes a process chamber having a substrate holder configured for holding the substrate in place during deposition, and an inlet for introduction of reactants. The apparatus further includes a controller comprising program instructions for depositing the SnO layer according to methods provided herein.

According to another aspect, a system for processing a semiconductor substrate with the use of SnO spacers is provided. The system includes one or more deposition process chambers and one or more etch process chambers, and a controller comprising program instructions for processing the semiconductor substrate in accordance with the methods provided herein.

According to another aspect, a system is provided herein which includes any of the apparatuses or systems provided herein, and a stepper.

According to another aspect, a non-transitory computer machine-readable medium is provided, which includes program instructions for control of any of the apparatuses or systems provided herein. The instructions include code for processing methods provided herein.

These and other aspects of implementations of the subject matter described in this specification are set forth in the accompanying drawings and the description below.

DETAILED DESCRIPTION

In the following detailed description, numerous specific implementations are set forth in order to provide a thorough understanding of the disclosed implementations. However, as will be apparent to those of ordinary skill in the art, the disclosed implementations may be practiced without these specific details or by using alternate elements or processes. In other instances well-known processes, procedures, and components have not been described in detail so as not to unnecessarily obscure aspects of the disclosed implementations.

In this application, the terms "semiconductor substrate" "wafer," "substrate," "wafer substrate" and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the term "semiconductor substrate" refers to a substrate that contains a semiconductor material anywhere within the substrate, and may include layers of other materials. The following detailed description assumes the disclosed implementations are implemented on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

Methods are herein provided for processing semiconductor substrate using tin oxide (SnO) spacers. Tin oxide (also referred here to as SnO), as used herein, refers to materials that include tin (Sn) and oxygen (O), and may optionally include hydrogen. Tin oxide (SnO), as used herein, may further include small amounts of other elements, such as carbon, and nitrogen, where the total amount of other elements is 10 atomic % or less (where hydrogen is not included in the calculation of the content). For example ALD-deposited SnO can contain about 0.5-5 atomic % carbon. The term "SnO", as used herein, does not indicate the stoichiometry of oxide, which may vary. In some specific embodiments, the stoichiometry of SnO is about 1 tin atom per two oxygen atoms.

It is understood that other materials, discussed herein, such as silicon (Si), carbon (C), silicon oxide ($SiO_2$), and silicon nitride (SiN) may optionally include hydrogen. Other elements can be present in these materials in small amounts, such as with combined content of other elements of 10 atomic % or less (excluding hydrogen). For example, the term "silicon oxide" includes carbon-doped silicon oxide, and other doped forms of silicon oxide.

Figure 7:
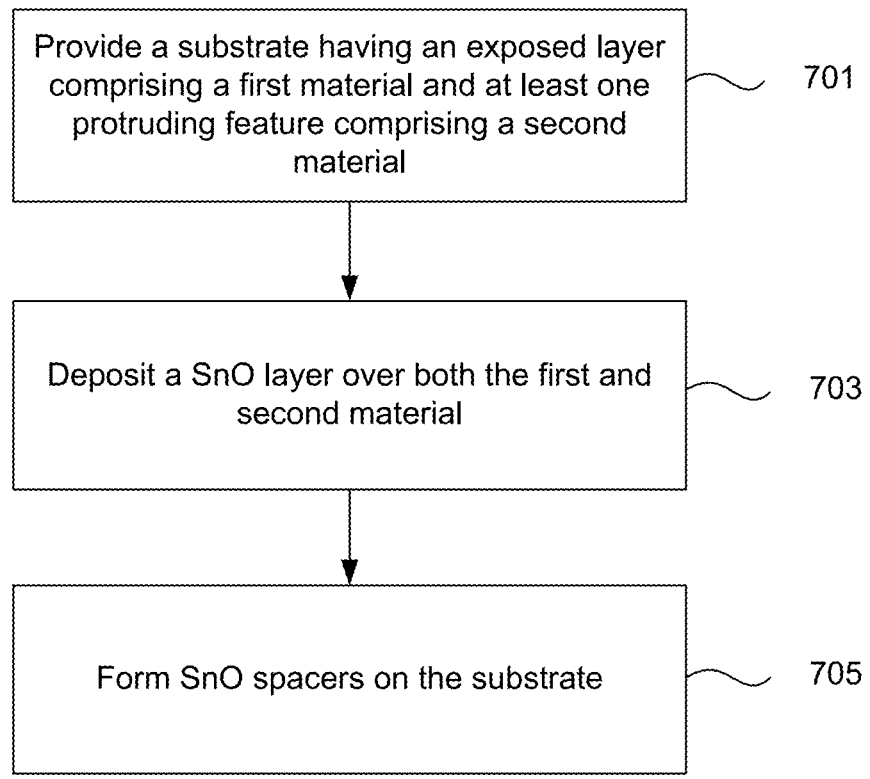
FIG. 7 is a process flow diagram for a processing method according to an embodiment provided herein.
Figure 8:
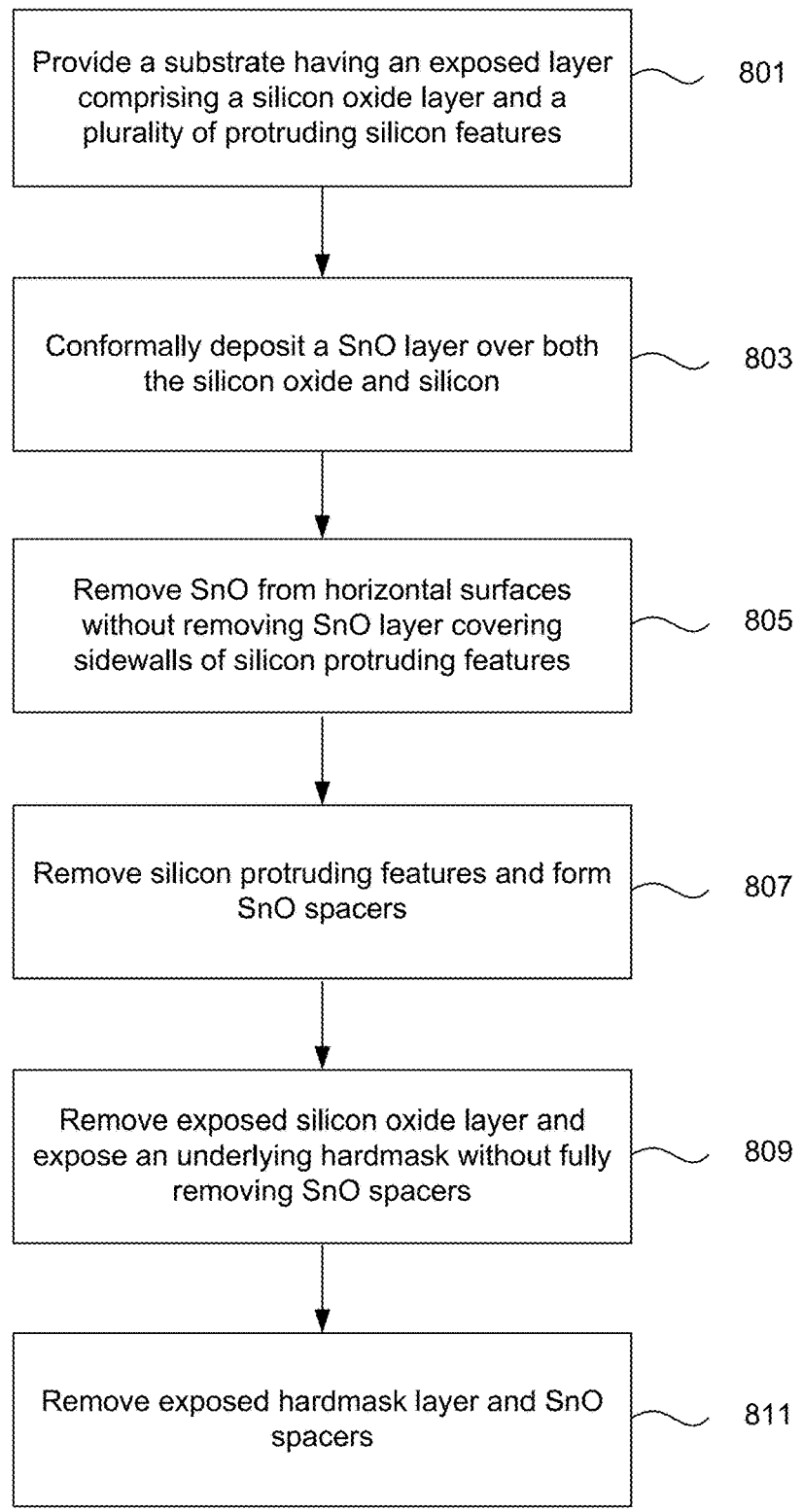
FIG. 8 is a process flow diagram for a processing method according to an embodiment provided herein.

The use of tin oxide spacers is illustrated with reference to FIGS. 1-6, which provide schematic cross-sectional views of a semiconductor substrate at different stages of processing. FIGS. 7 and 8 provide process flow diagram for the semiconductor substrate processing methods.

Figure 1:
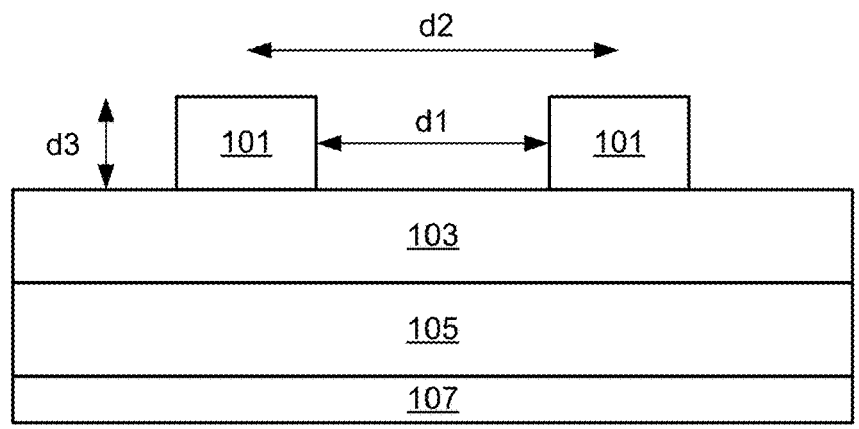
FIGS. 1-6 show schematic cross-sectional views of a semiconductor substrate undergoing processing according to an embodiment described herein.

Referring to FIG. 7, the process starts in 701, by providing a substrate having an exposed layer of a first material and at least one protruding feature comprising a second material. The layer of the first material is referred to as an etch stop layer (ESL), and the protruding feature is referred to as a mandrel. An illustrative substrate is shown in FIG. 1, which shows two mandrels 101 residing on an ESL 103. The distance d1 between the neighboring mandrels is, in some embodiments, between about 10-100 nm. In some embodiments relatively larger distances of about 40-100 nm are used. In other applications, the distance between closest mandrels is between about 10-30 nm. The distance between the centers of closest mandrels, d2, which is also referred to as pitch, is, in some embodiments, between about 30-130 nm. In some embodiments, the pitch is between about 80-130 nm. In other embodiments, the pitch is between about 30-40 nm. The height of the mandrels d3 is typically between about 20-200 nm, such as between about 50-100 nm.

The materials of the mandrel and of the ESL are selected such as to allow subsequent selective etching of the mandrel material in the presence of exposed tin oxide, and selective etching of the ESL material in the presence of exposed tin oxide. Thus, the ratio of the etch rate of the ESL material to the etch rate of tin oxide is greater than 1, more preferably greater than about 1.5, such as greater than about 2 for a first etch chemistry. Similarly, the ratio of the etch rate of the mandrel material to the etch rate of tin oxide is greater than 1, more preferably greater than about 1.5, such as greater than about 2 for a second etch chemistry.

In some embodiments the ESL material is selected from the group consisting of silicon oxide based material, silicon nitride, and combinations thereof, whereas the mandrel material is amorphous silicon (doped or undoped) or carbon (doped or undoped). Examples of dopants that are used for silicon and carbon include without limitation N, S, B and W. The ESL layer and the mandrels can be formed by physical vapor deposition (PVD), chemical vapor deposition (CVD), ALD (without plasma or by PEALD) or plasma enhanced chemical vapor deposition (PECVD) and the pattern of the mandrels can be defined using photolithographic techniques.

Referring again to the substrate shown in FIG. 1, the ESL layer 103 resides over and in contact with the target layer 105. The target layer 105 is the layer that needs to be patterned. The target layer 105 may be a semiconductor, dielectric or other layer and may be made of silicon (Si), silicon oxide ($SiO_2$), silicon nitride (SiN), or titanium nitride (TiN), for example. In some embodiments the target layer is referred to as a hardmask layer and includes metal nitride, such as titanium nitride. The target layer 105 may be deposited by ALD(without plasma or by PEALD), CVD, or other suitable deposition technique.

The target layer 105 resides over and in contact with layer 107, which is in some embodiments a BEOL layer, that includes a plurality of metal lines embedded into a layer of dielectric material.

Figure 2:
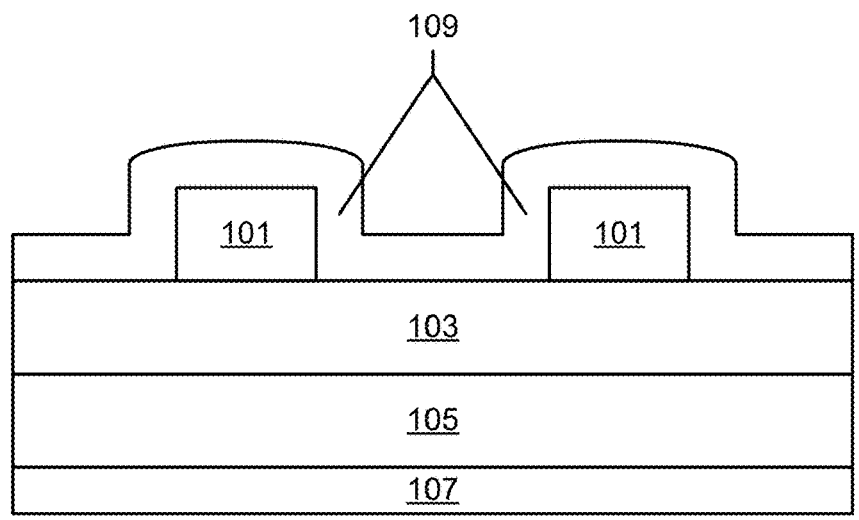

Referring again to FIG. 7, the process follows in 703 by depositing a SnO layer over both the first and second material. Referring to the structure shown in FIG. 2, the SnO layer 109 is deposited over the ESL 103, and over the mandrels 101, including the sidewalls of the mandrels. The SnO layer is deposited by any suitable method such as by CVD (including PECVD), ALD (including PEALD), sputtering, etc. In some embodiments it is preferable to deposit the SnO film conformally, such that it follows the surface of the layer 103 and the mandrels 101, as shown in FIG. 2. In some embodiments the SnO layer is deposited conformally to a thickness of between about 5-30 nm, such as between about 10-20 nm. One of the suitable deposition methods of conformal SnO film is ALD. Thermal or plasma enhanced ALD can be used. In a typical thermal ALD method, the substrate is provided to an ALD process chamber and is sequentially exposed to a tin-containing precursor, and an oxygen-containing reactant, where the tin-containing precursor and the oxygen containing reactant are allowed to react on the surface of the substrate to form SnO. The ALD process chamber is typically purged with an inert gas after the substrate is exposed to the tin-containing precursor, and before the oxygen-containing reactant is admitted to the process chamber to prevent reaction in the bulk of the process chamber. Further, the ALD process chamber is typically purged with an inert gas after the substrate has been treated with the oxygen-containing reactant. The sequential exposure is repeated for several cycles, e.g., between about 10-100 cycles can be performed until the SnO layer having desired thickness is deposited. Examples of suitable tin-containing precursors include halogenated tin-containing precursors (such as $SnCl_4$, and $SnBr_4$), and non-halogenated tin-containing precursors, such as organotin compounds, which include alkyl substituted tin amides and the like. Specific examples of alkyl substituted tin amides that are suitable for ALD are tetrakis(dimethylamino) tin, tetrakis (ethylmethylamino) tin, $N^2,N^3$-di-tert-butyl-butane-2,3-di-amino-tin(II) and (1,3-bis(1,1-dimethylethyl)-4,5-dimethyl-(4R, 5R)-1,3,2-diazastannolidin-2-ylidine. Oxygen-containing reactants include without limitation oxygen, ozone, water, hydrogen peroxide, and NO. Mixtures of oxygen-containing reactants can also be used. The deposition conditions will vary depending on the choice of ALD reactants, where more reactive precursors will generally react at lower temperatures than less reactive precursors. The processes typically will be carried out at a temperature of between about 20-500° C., and at a sub-atmospheric pressure. The temperature and pressure are selected such that the reactants remain in the gaseous form in the process chamber to avoid condensation. Each reactant is provided to the process chamber in a gaseous form either alone or mixed with a carrier gas, such as argon, helium, or nitrogen. The flow rates of these mixtures will depend on the size of the process chamber, and are in some embodiments between about 10-10,000 sccm.

A specific example of thermal ALD process conditions that are suitable for depositing a conformal SnO layer provided herein is described in an article by Li et al. titled "Tin Oxide with Controlled Morphology and Crystallinity by Atomic Layer Deposition onto Graphene Nanosheets for Enhanced Lithium Storage" (*Advanced Functional Materials*, 2012, 22, 8, 1647-1654) which is herein incorporated by reference in its entirety. The process includes sequentially and alternately exposing the substrate in an ALD vacuum chamber to $SnCl_4$ (the tin-containing precursor) and deionized water (the oxygen-containing reactant) at a temperature of 200-400° C. In a specific example of an ALD cycle, a mixture of $SnCl_4$ vapor with $N_2$ carrier gas is introduced into the ALD process chamber for 0.5 seconds, and is then exposed to the substrate for 3 seconds. Next the ALD process chamber is purged with $N_2$ for 10 seconds to remove $SnCl_4$ from the bulk of the process chamber, and a mixture of $H_2O$ vapor with $N_2$ carrier gas is flowed into the process chamber for 1 second and is exposed to the substrate for 3 seconds. Next, the ALD process chamber is purged with $N_2$ and the cycle is repeated. The ALD process is performed at subatmospheric pressure (e.g., 0.4 Torr) and at a temperature of 200-400° C.

Another example of thermal ALD process conditions that are suitable for depositing SnO films in the methods provided herein, is given in an article by Du et al. titled "In situ Examination of Tin Oxide Atomic Layer Deposition using Quartz Crystal Microbalance and Fourier Transform Infrared Techniques" (*J. Vac. Sci. Technol.* A 23, 581 (2005)), which is herein incorporated by reference in its entirety. In this process the substrate is sequentially exposed to $SnCl_4$ and $H_2O_2$ in an ALD process chamber at a temperature of between about 150-430° C.

While the use of halogenated tin precursors in ALD is suitable in many embodiments, in some embodiments it is more preferable to use non-halogenated organotin precursors to avoid corrosion problems that may occur with the use of halogenated precursors such as $SnCl_4$. Examples of suitable non-halogenated organotin precursors include alkylaminotin (alkylated tin amide) precursors, such as tetrakis(dimethylamino) tin. An example of a suitable thermal ALD deposition method that uses this precursor is provided in an article by Elam et al., titled "Atomic Layer Deposition of Tin Oxide Films using Tetrakis(dimethylamino) tin" (*J. Vac. Sci. Technol.* A 26, 244 (2008)), which is herein incorporated by reference in its entirety.

In this method the substrate is sequentially exposed in an ALD chamber to tetrakis(dimethylamino) tin and $H_2O_2$ at a temperature of between about 50-300° C. Advantageously, the use of this precursor allows deposition of SnO films at low temperatures of 100° C. or less. For example, SnO films can be deposited at 50° C. without the use of plasma to enhance reaction rate. Another example of thermal ALD of SnO using tetrakis(dimethylamino) tin and $H_2O_2$ is provided in an article by Elam et al. titled "Atomic Layer Deposition of Indium Tin Oxide Thin Films Using Nonhalogenated Precursors" (*J. Phys.Chem.* C 2008, 112, 1938-1945), which is herein incorporated by reference.

Another example of low temperature thermal ALD process with the use of a reactive organotin precursor is provided in an article by Heo et al., titled "Low temperature Atomic Layer Deposition of Tin Oxide" (*Chem. Mater.*, 2010, 22(7) 4964-4973), which is herein incorporated by reference in its entirety. In this deposition process (which is suitable for depositing SnO films provided herein), the substrate is sequentially exposed in an ALD vacuum process chamber to $N^2$, $N^3$-di-tert-butyl-butane-2,3-diamino-tin(II) and 50% $H_2O_2$. These reactants are vaporized and each is provided to the process chamber mixed with an $N_2$ carrier gas. The chamber is purged with $N_2$ after each exposure of the substrate to a reactant. The deposition can be carried out at a temperature of between about 50-150° C.

While hydrogen peroxide generally works well as an oxygen-containing reactant for formation of SnO in ALD processes, it may sometimes provide insufficient control over SnO film growth due to $H_2O_2$ decomposition. In some embodiments, a more stable oxygen-containing precursor, such as NO, is used. An example of suitable process conditions with the use of NO as an oxygen-containing reactant is provided in an article by Heo et al., titled "Atomic Layer Deposition of Tin Oxide with Nitric Oxide as an Oxidant Gas" (*J. Mater. Chem.*, 2012, 22, 4599), which is herein incorporated by reference. The deposition involves exposing the substrate sequentially to a cyclic Sn(II) amide (1,3-bis(1,1-dimethylethyl)-4,5-dimethyl-(4R, 5R)-1,3,2-diazastannolidin-2-ylidine and to NO at a temperature of about 130-250° C.

In some embodiments, SnO films are deposited by PEALD. The same types of tin-containing precursors and oxygen-containing reactants as described above for thermal ALD can be used. In PEALD the ALD apparatus is equipped with a system for generating plasma in the process chamber, and for treating the substrate with the plasma. In a typical PEALD process sequence, the substrate is provided to the PEALD process chamber and is exposed to the tin-containing precursor which adsorbs on the surface of the substrate. The process chamber is purged with an inert gas (e.g., argon or helium) to remove the precursor from the process chamber, and the substrate is exposed to an oxygen-containing reactant which is introduced into the process chamber. Concurrently with the introduction of the oxygen-containing reactant or after a delay, plasma is formed in the process chamber. The plasma facilitates the reaction between the tin-containing precursor and the oxygen-containing reactant on the surface of the substrate that results in formation of SnO. Next, the process chamber is purged with an inert gas, and the cycle comprising tin precursor dosing, purging, oxygen-containing reactant dosing, plasma treatment, and second purging is repeated as many times as necessary to form a SnO film of desired thickness.

An example of process conditions that are suitable for PEALD formation of SnO film is provided in an article by Seop et al., titled "The Fabrication of Tin Oxide Films by Atomic Layer Deposition using Tetrakis(ethylmethylamino) tin Precursor" (*Transactions on Electrical and Electronic Materials*, 2009, 10, 5, 173-176), which is herein incorporated by reference. The substrate is provided into a PEALD process chamber and is exposed to tetrakis(ethylmethylamino) tin in an absence of plasma with an exposure of 4 seconds. Next, the tin-containing precursor is purged from the process chamber by flowing argon through the process chamber for 20 seconds. Then, $O_2$ is injected for 2 seconds with additional 2 seconds with radio frequency (RF) power of 100 W. This is followed by an argon purge, which completes one PEALD cycle. In this example, the process is conducted at a temperature range of 50-200° C. and at a pressure of 0.8 Torr.

While ALD (both thermal and plasma enhanced) is one of preferred methods for depositing SnO films, it is understood that other SnO deposition methods, such as CVD, PECVD, and sputtering can also be used.

Figure 3:
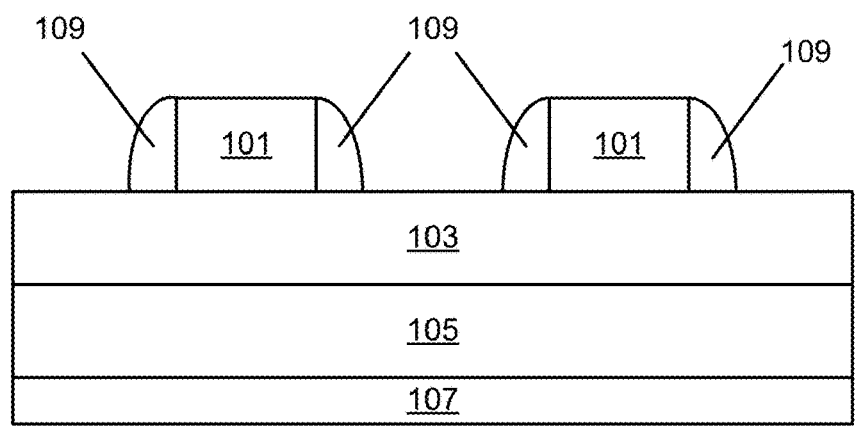
Figure 4:
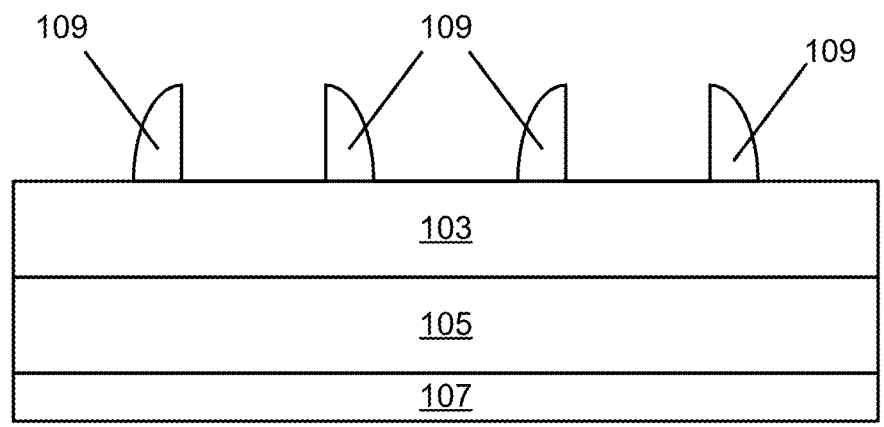

Referring to the process diagram of FIG. 7, after the SnO layer has been deposited, the process follows in 705 by forming SnO spacers on the substrate. Formation of SnO spacers is illustrated by FIG. 3 and FIG. 4. First, SnO layer 109 is etched from the horizontal surfaces over layer 103 and over mandrels 101, without being fully etched from positions that adhere to the sidewalls of mandrels 101. This etch exposes the layer 103 everywhere with the exception of locations near the sidewalls of the mandrels 101. Further, this etch exposes the top portions of the mandrels. The resulting structure is shown in FIG. 3. The chemistry of this etch will depend on the type of materials that are used for layers 101 and 103. The etch used for SnO layer removal in this step is selected such that the ratio of SnO etch rate to mandrel material etch rate is greater than 1, and such that the ratio of SnO etch rate to layer 103 material etch rate is greater than 1. SnO can be etched using a number of wet etching and dry etching techniques. In wet etching the substrate is contacted with the wet etchant, which can be, for example, sprayed onto the substrate. Alternatively, the substrate can be dipped into the wet (aqueous) etchant. In dry etching the substrate is positioned in a dry etch chamber, where the substrate is contacted with a gaseous etchant with or without the use of plasma. "Wet etching" as used herein refers to etching with liquid etchants, whereas "dry etching" refers to etching with gaseous (including vaporized)

etchants, regardless of the use of water. One example of wet etching that is suitable for etching SnO is an acid etch, where the substrate is contacted with an aqueous solution of an acid, such as HCl.

In one implementation of an HCl etch the substrate is contacted with an aqueous solution prepared from an aqueous solution of HCl and chromium metal. This etching chemistry is described in an article by Wu et al., titled "Texture Etched $SnO_2$ Glasses Applied to Silicon Thin-film Solar Cells" (*Journal of Nanomaterials*, vol. 2014, 1-9), which is herein incorporated by reference in its entirety. In this embodiment the SnO layer is etched by a preformed mixture containing HCl and Cr(II) ions, which reduce Sn(IV) to Sn(II) and assist in dissolution of oxide. The HCl:Cr etching solution is prepared in one implementation by dissolving chromium metal (20 g) in 50% aqueous HCl solution (5 L) at 90° C. The chromium concentration can vary from 0.05 to 1 wt %. The etching is performed in some embodiments at a temperature range of 20-100° C.

In another example of a wet etching process the SnO layer is treated with aqueous HX (where X is Cl, Br, or I) in a presence of zinc powder. In this method the oxides are reduced directly by the hydrogen formed in a reaction of zinc with HX. In another wet etching embodiment, SnO is etched by aqueous phosphoric acid, e.g., provided at $H_3PO_4$: $H_2O$ ratio of 1:3. Further, SnO films can be etched by a mixture of aqueous $HNO_3$ and HCl or by aqueous HI at a temperature of about 60° C.

One example of dry etch chemistry for SnO removal includes treatment with HBr in a plasma. This treatment is described in an article by Kwon et al., titled "Etch Mechanism of $In_2O_3$ and $SnO_2$ thin films in HBr-based inductively coupled plasmas" (*J. Vac. Sci. Technol.* A 28, 226 (2010)), which is herein incorporated by reference in its entirety. The substrate is treated with inductively coupled plasma formed in a process gas containing HBr and argon.

In another embodiment, HBr-containing process gas further includes an oxygen-containing compound, such as $O_2$. In some embodiments, etching is performed by exposing the substrate to a plasma formed in a process gas comprising HBr, $O_2$, and $N_2$. This type of etch can remove SnO material selectively relative to materials, such as silicon, and silicon oxide. It is noted that the surface of the silicon mandrels is typically covered with a layer of silicon dioxide, which protects it from being etched with this etch chemistry. In some embodiments, the process conditions of this etching step include applying a relatively high radio frequency (RF) bias to the substrate holder, such as to increase the energy of ions in the plasma and increase the etch rate of SnO material. Other dry etching chemistries that are suitable for SnO removal include plasma treatment in a mixture of $Cl_2$ and hydrocarbon, and plasma treatment in a process gas comprising chlorohydrocarbon, such as $CH_2Cl_2$ or $CHCl_3$. In some embodiments, the substrate containing an exposed SnO layer is contacted with a plasma formed in a process gas comprising $CH_4$ and $Cl_2$.

Yet another suitable dry etching chemistry for removal of SnO films is hydrogen-based plasma. In some embodiments, SnO is etched by exposing the substrate to a plasma formed in a process gas comprising $H_2$. In some embodiments plasma is formed in a process gas formed in a mixture of $H_2$ and a hydrocarbon (e.g., $CH_4$).

In some embodiments removal of SnO layer from horizontal portions of the substrate involves using two steps with two different chemistries. In a first step, referred to as the main etch, the bulk of SnO layer is removed from horizontal surfaces, without fully exposing the underlying layers of mandrel and ESL materials. Etch chemistry of the main etch, therefore, does not need to be selective. In some embodiments the main etch is performed by treating the substrate with a plasma formed in a process gas comprising $Cl_2$ and a hydrocarbon (e.g., $Cl_2$ and $CH_4$). After the main etch etches through the SnO film or shortly before, the etching chemistry is switched to an over etch chemistry. The endpoint for the main etch can be detected by using an optical probe, which will signal when the mandrel material or ESL material becomes exposed. Over etch chemistry is used to remove leftover SnO film without substantially etching the materials of mandrel and ESL. The ratio of the etch rate of SnO to the etch rate of the mandrel material for the over etch chemistry is preferably greater than 1. The ratio of the etch rate of SnO to the etch rate of the ESL material for the over etch chemistry is also preferably greater than 1. In some embodiments (e.g., when silicon mandrel and silicon oxide ESL are used) the over etch includes exposing the substrate having leftover SnO film, exposed mandrels and exposed ESL to a plasma formed in a process gas comprising HBr, $N_2$ and $O_2$.

The SnO etching in this step removes SnO from horizontal surfaces, but the vertical portions of SnO layer at the sidewalls of the mandrels remain on the substrate. Next, mandrels 101 are removed from the substrate leaving exposed SnO spacers 101 and an exposed ESL 103, as shown in FIG. 4. Removal of the mandrels is performed by exposing the substrate to an etch chemistry that selectively etches the mandrel material. Thus, the ratio of the etch rate of the mandrel material to the etch rate of the SnO in this step is greater than 1, and is more preferably greater than 1.5. Further, the etch chemistry used in this step should selectively etch the mandrel material relative to ESL material. A variety of etching methods can be used, and specific choice of chemistry depends on the material of the mandrel and on the material of the ESL layer. When the mandrel is made of amorphous silicon and the ESL material is silicon oxide, mandrels can be removed by using an oxidative oxygen-containing plasma. For example, silicon mandrels can be selectively etched by exposing the substrate to a plasma formed in a process gas composed of HBr and $O_2$. This chemistry will selectively etch the silicon material in a presence of SnO and silicon oxide. In some embodiments, before the etch starts, the thin protective layer of silicon oxide is removed from the surface of silicon mandrels. This can be done by briefly exposing the substrate to a plasma formed in a process gas comprising a fluorocarbon. After removal of the protective silicon oxide layer from the mandrels, the silicon is selectively etched. In some embodiments, it is preferable to use a relatively small RF bias, or no external bias at all for the substrate in this step. If no external bias is used, the self bias of the substrate (10-20 V) is sufficient. Under no bias or low bias conditions, the $HBr/O_2$ plasma will selectively etch silicon in the presence of SnO and silicon oxide. The resulting structure showing SnO spacers after removal of the mandrels is shown in FIG. 4.

Figure 5:
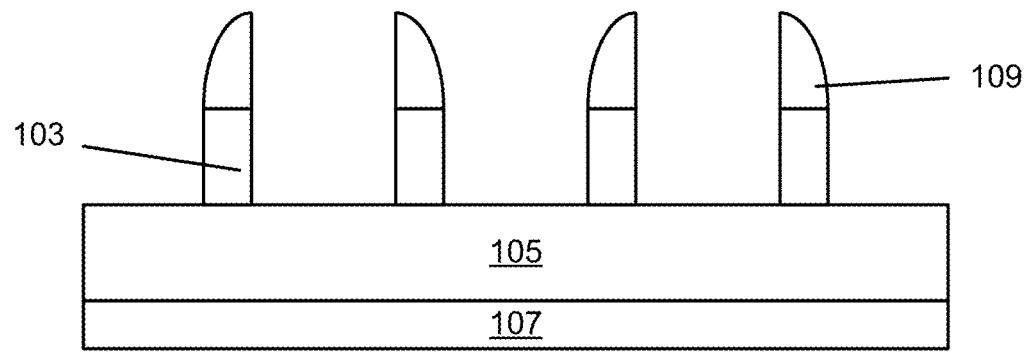
Figure 6:
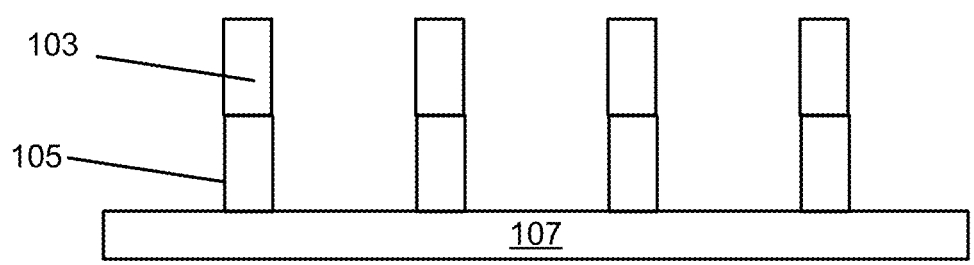

Next, the exposed ESL film 103 is etched to expose the underlying target layer 105 at all positions that are not protected by the SnO spacers 109. The resulting structure is shown in FIG. 5. The etch chemistry that is used in this step selectively etches the ESL material in the presence of SnO. In other words, the ratio of the etch rate of the ESL material to the etch rate of SnO is greater than 1, and is more preferably greater than 1.5. The specific type of chemistry used in this step will depend on the type of the ESL material. When silicon oxide and silicon oxide based materials are used, selective etching can be accomplished by exposing the substrate to a plasma formed in a process gas comprising a fluorocarbon. For example, the ESL film can be etched by a plasma formed in a process gas comprising one or more of $CF_4$, $C_2F_6$, and $C_3F_8$.

In the next step, the target layer 105 is etched at all positions that are not protected by the ESL film 103, to expose the underlying layer 107. The SnO spacers 109 are also removed in this etching step providing a patterned structure shown in FIG. 6. In some embodiments, the etch chemistry used in this step is selected to remove both the target material and the SnO spacer material. In other embodiments, two different etching steps with different chemistries can be used to pattern the target layer 105 and to remove SnO spacers 109 respectively. A number of etching chemistries can be used depending on the chemistry of the target layer. In one embodiment the target layer 105 is a metal nitride layer (e.g., a TiN) layer. In this embodiment the metal layer is etched, and the SnO spacers can be removed using a single etch chemistry by exposing the substrate to a plasma formed in a process gas comprising $Cl_2$ and a hydrocarbon (e.g., $CH_4$). Generally, SnO spacers can be removed using any of SnO etching methods described above.

At any time during the described process sequence the etching and/or deposition chambers can be cleaned from tin-containing particles by converting them to volatile tin hydride, which can be easily removed by purging and/or evacuation. In some embodiments this conversion is performed by contacting the substrate with a plasma formed in a hydrogen-containing gas, such as $H_2$, $NH_3$ or mixtures thereof.

A specific example of semiconductor substrate patterning with the use of SnO spacers is provided in a process flow diagram of FIG. 8. Reference will be made to the device structures shown in FIGS. 1-6. The process starts in 801 by providing a substrate having an exposed layer comprising a silicon oxide layer and a plurality of protruding silicon features. In this example, referring to FIG. 1, the substrate includes an exposed silicon oxide layer 103 and a plurality of protruding features (mandrels) 101 made of amorphous silicon. A hardmask layer 105 resides below the silicon oxide layer 103. In this example the hardmask layer is made from titanium nitride. The hardmask layer 105 overlies the BEOL layer 107.

Next in operation 803, a SnO layer is deposited conformally over both the silicon oxide layer and the silicon protruding features. In some embodiments, conformal deposition is performed by ALD (thermal or plasma assisted), as it was previously described. FIG. 2 illustrates a conformal SnO layer 109 covering the surface of silicon mandrels and silicon oxide layer. In operation 805 SnO residing on the horizontal surfaces is removed, without removing SnO layer residing on the sidewalls of the silicon protruding features. In this example, removal is performed by two-step etching. In a first step, main etch is performed, by exposing the substrate shown in FIG. 2 to a plasma formed in a process gas comprising $Cl_2$ and $CH_4$. Next after most of SnO film is removed from horizontal surfaces, the leftover SnO film is removed from horizontal surfaces by exposing the substrate to an over etch chemistry, which includes plasma formed in a process gas composed of HBr, $O_2$, and $N_2$. This step is performed with application of relatively high bias to the substrate pedestal. The silicon mandrels are covered with a protective layer of silicon oxide during this step, which is not appreciably etched by this chemistry. The resulting structure is shown in FIG. 3, where the silicon oxide layer 103 and the silicon mandrels 101 are exposed.

Next, in operation 807, the silicon protruding features are removed and SnO spacers are thereby formed as shown in FIG. 4. In this example the silicon mandrels are selectively etched by exposing the substrate to a plasma formed in a process gas composed of HBr and $O_2$ without biasing the substrate, or by using a lower bias than the bias used in the $HBr/O_2/N_2$ etch of the SnO layer. In some embodiments, prior to removal of silicon mandrels, the protective silicon oxide layer is etched from the surface of the silicon, for example by briefly exposing the substrate to a plasma formed in a process gas comprising a flurocarbon.

In the subsequent step 809, the exposed silicon oxide layer is removed and the underlying hardmask layer is exposed. The silicon oxide is selectively etched by exposing the substrate to a plasma formed in a process gas comprising one or more fluorocarbons.

After this step, the etching process chamber, where the fluorocarbon etch was performed can be cleaned to remove any particles containing tin. For example, tin fluoride can inadvertently be deposited on the surfaces of the chamber. After the substrate is removed from the process chamber, a hydrogen containing gas, such as $H_2$, $NH_3$ or a mixture of these gases is flowed into the process chamber to convert the tin-containing particles to volatile tin hydride. The cleaning is performed in one example by forming a plasma in this process gas. In other embodiments, the chamber is exposed to $H_2$ in an absence of plasma. The substrate obtained after removal of the silicon oxide layer is shown in FIG. 5, which shows the exposed hardmask layer 105. Next in the operation 811, the exposed hardmask layer and the SnO spacers are removed. In one example the TiN hardmask and the SnO layer are formed by exposing the substrate shown in FIG. 5 to a plasma formed in a process gas composed of $Cl_2$ and $CH_4$.

Tin oxide compares favorably to other spacer materials, such as $TiO_2$ and $SiO_2$, because it is characterized be a relatively high modulus which correlates with desirable etch selectivity properties. The modulus of bulk tin (II) oxide is 360 GPa, which is greater than the modulus of titanium dioxide (210 GPa) and of silicon dioxide (70 GPa). Therefore, problems related to low etch selectivity, such as pitch walking are addressed by using SnO spacers. Furthermore, tin hydride has a melting point of −52° C., whereas melting point of titanium hydride is greater than 350° C. When titanium oxide is used as a spacer material it is not possible to clean process chambers by converting titanium-containing particles (e.g., titanium chloride or fluoride) to titanium hydride, because titanium hydride is not volatile. In contrast, when tin oxide is used as spacer material, the process chambers can be easily cleaned by converting tin-containing particles to a volatile tin hydride that can be purged from the process chambers.

Apparatus

Another aspect of the implementations disclosed herein is an apparatus and a system configured to accomplish the methods described herein. A suitable apparatus includes hardware for accomplishing the process operations and a system controller having instructions for controlling process operations in accordance with the disclosed implementations. In some embodiments, a deposition apparatus for depositing the SnO layer is provided. In some embodiments this is an ALD apparatus (e.g., a PEALD apparatus). In other embodiments it may be a CVD apparatus, or a sputtering apparatus that includes a tin oxide target. The apparatus includes a process chamber, a support for holding the substrate in place during the deposition, an inlet for flowing process gasses into the process chamber, and may also include a system for forming a plasma in the process chamber. Further, the apparatus includes a controller having program instructions for depositing the SnO layer, according to methods provided herein.

The dry etching operations provided herein can be performed in a variety of apparatuses that are equipped with delivery lines and control mechanisms configured for delivery of gaseous reagents. Examples of suitable process chambers include plasma etch chambers, RIE chambers, isotropic etch chambers, as well as resist strip chambers. In some embodiments the dry etch apparatus includes a process chamber housing a support for holding the substrate, and delivery lines for delivering one or more process gasses to the process chamber. In some embodiments the apparatus further includes a system for generating a plasma in the process gas. The process chamber may further include a controller comprising program instructions for performing the etching. The instructions may include the instructions for delivery of the process gas, setting the temperature and pressure in the process chamber, and instructions on plasma parameters.

The wet etching operations provided herein can be performed in various apparatuses configured for delivering wet etchant onto a substrate. These may be configured for dipping the substrate in a liquid etchant, spraying or streaming the etchant onto the substrate or for other methods of contact. In some embodiments the apparatus includes a support for holding the substrate in place during etchant delivery, where the support may be configured for rotating the substrate, and one or more delivery ports (e.g., nozzles) configured to spray or stream the liquid etchant onto the substrate. The apparatus may further include a controller with program instructions for the wet etching process.

In another aspect, a system is provided, where the system includes a deposition chamber configured for depositing SnO layer, and one or more etching chambers (such as RIE chambers, wet etching chambers) configured for etching one or more materials on the substrate. The system further includes a controller having program instructions for depositing SnO layer and for forming SnO spacers according to methods disclosed herein.

PEALD apparatus will now be described as an example of an apparatus that is suitable for deposition of SnO layers, according to methods provided herein.

In some embodiments the conformal deposition of the SnO layer is conducted in a PEALD reactor which is a part of a Vector Excel deposition module available from Lam Research Corp. of Fremont, Calif. A suitable process chamber includes a support for holding the wafer substrate during deposition (wafer pedestal), a generator for forming plasma in the process chamber, and conduits for delivering the components of the process gas (tin-containing precursor, oxygen-containing reactant, a carrier gas, etc.) to the process chamber. The apparatus is further configured for purging and/or evacuating the process chamber, and for maintaining a desired pressure and temperature in the process chamber during deposition.

Examples of PEALD process chambers are described in U.S. Pat. No. 6,416,822, U.S. Pat. No. 6,428,859, and U.S. Pat. No. 8,747,964 which are herein incorporated by reference in their entireties.

Figure 9:
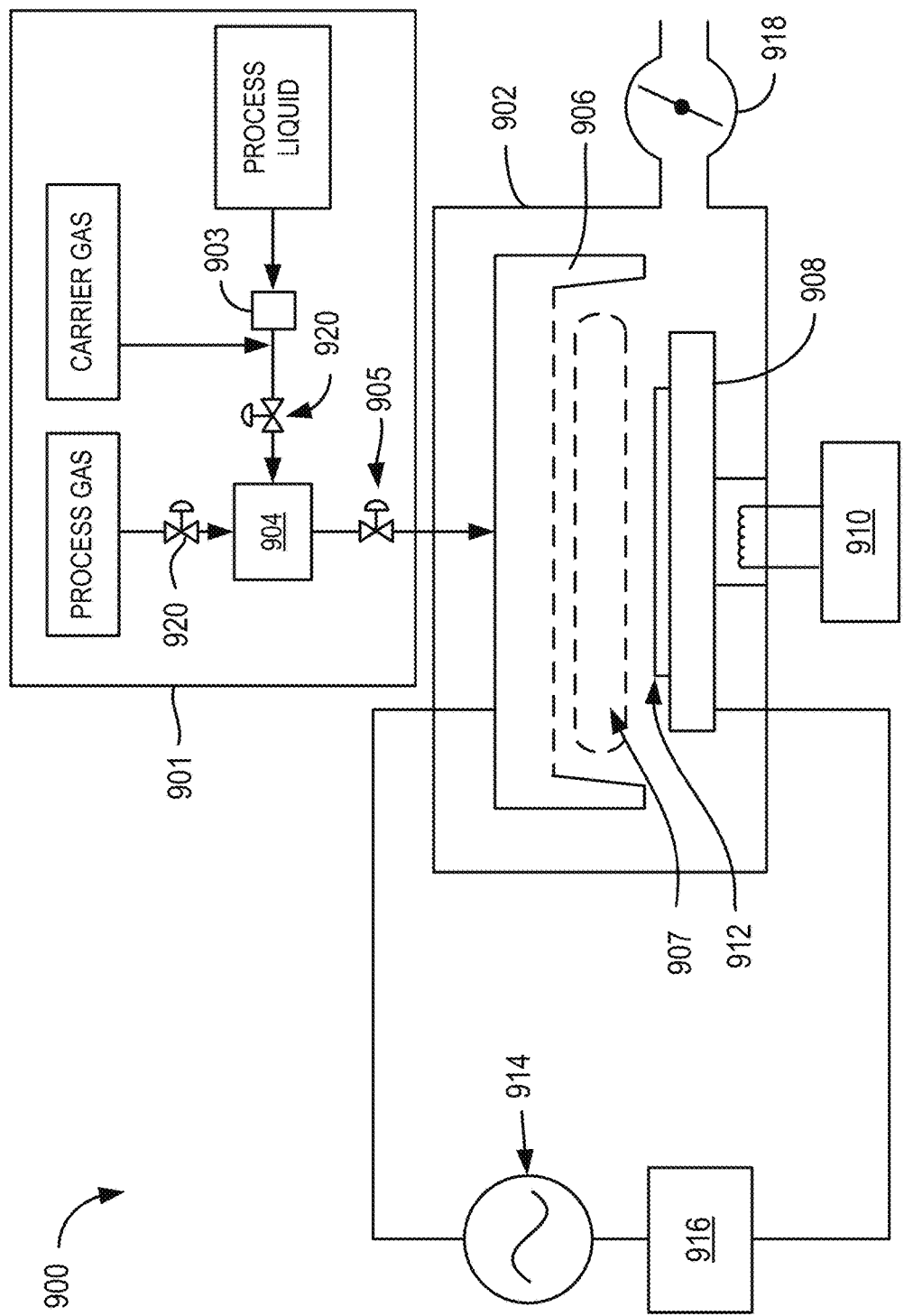
FIG. 9 is a schematic presentation of a plasma enhanced atomic layer deposition (PEALD) process station that is suitable for deposition of a SnO layer according to an embodiment provided herein.

FIG. 9 schematically shows an embodiment of a PEALD process station 900 that may be used to deposit provided SnO films. For simplicity, the process station 900 is depicted as a standalone process station having a process chamber body 902 for maintaining a low-pressure environment. However, it will be appreciated that a plurality of process stations 900 may be included in a common process tool environment. Further, it will be appreciated that, in some embodiments, one or more hardware parameters of process station 900, including those discussed in detail below, may be adjusted programmatically by one or more computer controllers.

Process station 900 fluidly communicates with reactant delivery system 901 for delivering process gases to a distribution showerhead 906. Reactant delivery system 901 includes a mixing vessel 904 for blending and/or conditioning process gases for delivery to showerhead 906. One or more mixing vessel inlet valves 920 may control introduction of process gases to mixing vessel 904. Similarly, a showerhead inlet valve 905 may control introduction of process gasses to the showerhead 906.

Some reactants may be stored in liquid form prior to vaporization at and subsequent delivery to the process station. For example, the embodiment of FIG. 9 includes a vaporization point 903 for vaporizing liquid reactant to be supplied to mixing vessel 904. In some embodiments, vaporization point 903 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 903 may be heat traced. In some examples, mixing vessel 904 may also be heat traced. In one non-limiting example, piping downstream of vaporization point 903 has an increasing temperature profile extending from approximately 100° C. to approximately 150° C. at mixing vessel 904.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 903. In one scenario, a liquid injector may be mounted directly to mixing vessel 904. In another scenario, a liquid injector may be mounted directly to showerhead 906.

In some embodiments, a liquid flow controller upstream of vaporization point 903 may be provided for controlling a mass flow of liquid for vaporization and delivery to process station 900. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 906 distributes process gases toward substrate 912. In the embodiment shown in FIG. 9, substrate 912 is located beneath showerhead 906, and is shown resting on a pedestal 908. It will be appreciated that showerhead 906 may have any suitable shape, and may have any suitable number and arrangement of ports for distributing processes gases to substrate 912.

In some embodiments, a microvolume 907 is located beneath showerhead 906. Performing an ALD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 908 may be raised or lowered to expose substrate 912 to microvolume 907 and/or to vary a volume of microvolume 907. For example, in a substrate transfer phase, pedestal 908 may be lowered to allow substrate 912 to be loaded onto pedestal 908. During a deposition process phase, pedestal 908 may be raised to position substrate 912 within microvolume 907. In some embodiments, microvolume 907 may completely enclose substrate 912 as well as a portion of pedestal 908 to create a region of high flow impedance during a deposition process.

Optionally, pedestal 908 may be lowered and/or raised during portions of the deposition process to modulate process pressure, reactant concentration, etc., within microvolume 907. In one scenario where process chamber body 902 remains at a base pressure during the deposition process, lowering pedestal 908 may allow microvolume 907 to be evacuated. Example ratios of microvolume to process chamber volume include, but are not limited to, volume ratios between 1:900 and 1:10. It will be appreciated that, in some embodiments, pedestal height may be adjusted programmatically by a suitable computer controller.

In another scenario, adjusting a height of pedestal 908 may allow a plasma density to be varied during plasma activation and/or treatment cycles included in the deposition process. At the conclusion of the deposition process phase, pedestal 908 may be lowered during another substrate transfer phase to allow removal of substrate 912 from pedestal 908.

While the example microvolume variations described herein refer to a height-adjustable pedestal, it will be appreciated that, in some embodiments, a position of showerhead 906 may be adjusted relative to pedestal 908 to vary a volume of microvolume 907. Further, it will be appreciated that a vertical position of pedestal 908 and/or showerhead 906 may be varied by any suitable mechanism within the scope of the present disclosure. In some embodiments, pedestal 908 may include a rotational axis for rotating an orientation of substrate 912. It will be appreciated that, in some embodiments, one or more of these example adjustments may be performed programmatically by one or more suitable computer controllers.

Returning to the embodiment shown in FIG. 9, showerhead 906 and pedestal 908 electrically communicate with RF power supply 914 and matching network 916 for powering a plasma. In some embodiments, the plasma energy may be controlled by controlling one or more of a process station pressure, a gas concentration, an RF source power, an RF source frequency, and a plasma power pulse timing. For example, RF power supply 914 and matching network 916 may be operated at any suitable power to form a plasma having a desired composition of radical species. Examples of suitable powers are included above. Likewise, RF power supply 914 may provide RF power of any suitable frequency. In some embodiments, RF power supply 914 may be configured to control high- and low-frequency RF power sources independently of one another. Example low-frequency RF frequencies may include, but are not limited to, frequencies between 50 kHz and 900 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of the process gas and/or its individual components, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, pedestal 908 may be temperature controlled via heater 910. Further, in some embodiments, pressure control for deposition process station 900 may be provided by butterfly valve 918. As shown in the embodiment of FIG. 9, butterfly valve 918 throttles a vacuum provided by a downstream vacuum pump (not shown).

However, in some embodiments, pressure control of process station 900 may also be adjusted by varying a flow rate of one or more gases introduced to process station 900.

Figure 10:
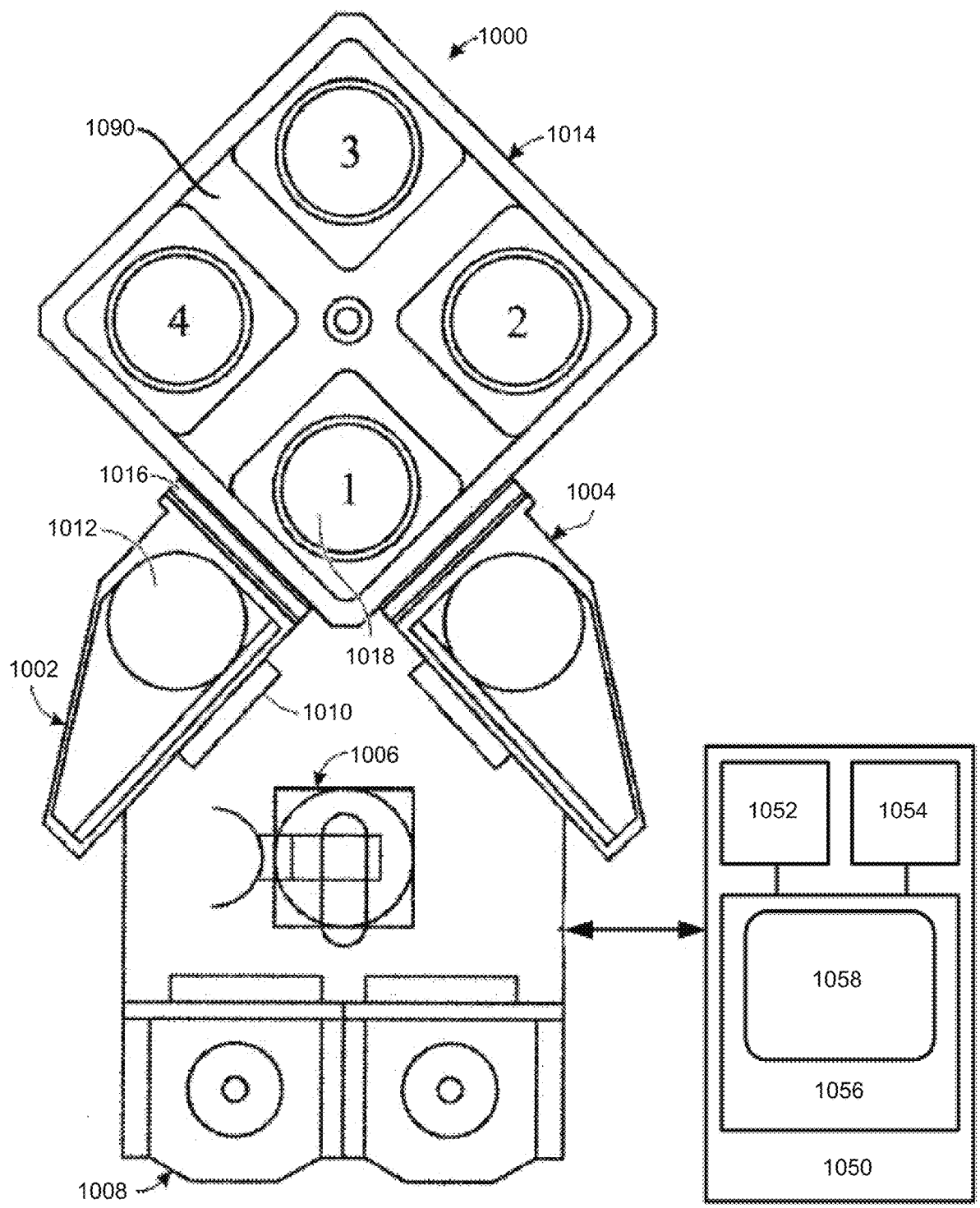
FIG. 10 shows a schematic view of a multi-station processing tool according to an embodiment provided herein.

In some embodiments, the substrates provided herein are processed in a multi-station tool. FIG. 10 shows a schematic view of an embodiment of a multi-station processing tool 1000 with an inbound load lock 1002 and an outbound load lock 1004, either or both of which may comprise a remote plasma source. A robot 1006, at atmospheric pressure, is configured to move wafers from a cassette loaded through a pod 1008 into inbound load lock 1002 via an atmospheric port 1010. A wafer is placed by the robot 1006 on a pedestal 1012 in the inbound load lock 1002, the atmospheric port 1010 is closed, and the load lock is pumped down. Where the inbound load lock 1002 comprises a remote plasma source, the wafer may be exposed to a remote plasma treatment in the load lock prior to being introduced into a processing chamber 1014. Further, the wafer also may be heated in the inbound load lock 1002 as well, for example, to remove moisture and adsorbed gases. Next, a chamber transport port 1016 to processing chamber 1014 is opened, and another robot (not shown) places the wafer into the reactor on a pedestal of a first station shown in the reactor for processing.

The depicted processing chamber 1014 comprises four process stations, numbered from 1 to 4 in the embodiment shown in FIG. 10. Each station has a heated pedestal (shown at 1018 for station 1), and gas line inlets. It will be appreciated that in some embodiments, each process station may have different or multiple purposes. While the depicted processing chamber 1014 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 10 also depicts an embodiment of a wafer handling system 1090 for transferring wafers within processing chamber 1014. In some embodiments, wafer handling system 1090 may transfer wafers between various process stations and/or between a process station and a load lock. It will be appreciated that any suitable wafer handling system may be employed. Non-limiting examples include wafer carousels and wafer handling robots. FIG. 10 also depicts an embodiment of a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. System control software 1058 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 1000. System control software 1058 may be configured in any suitable way. For example, various process tool component subroutines or control objects may be written to control operation of the process tool components necessary to carry out various process tool processes in accordance with the disclosed methods. System control software 1058 may be coded in any suitable computer readable programming language.

In some embodiments, system control software 1058 may include input/output control (IOC) sequencing instructions for controlling the various parameters described above. For example, each phase of a PEALD process may include one or more instructions for execution by system controller 1050.

Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 1050. The user interface may include a display screen, graphical software displays of the apparatus and/or process conditions, and user input devices such as pointing devices, keyboards, touch screens, microphones, etc.

In some embodiments, parameters adjusted by system controller 1050 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, Calif., or any of a variety of other commercially available processing systems. Two or more of the stations may perform the same functions. Similarly, two or more stations may perform different functions. Each station can be designed/configured to perform a particular function/method as desired.

Figure 11:
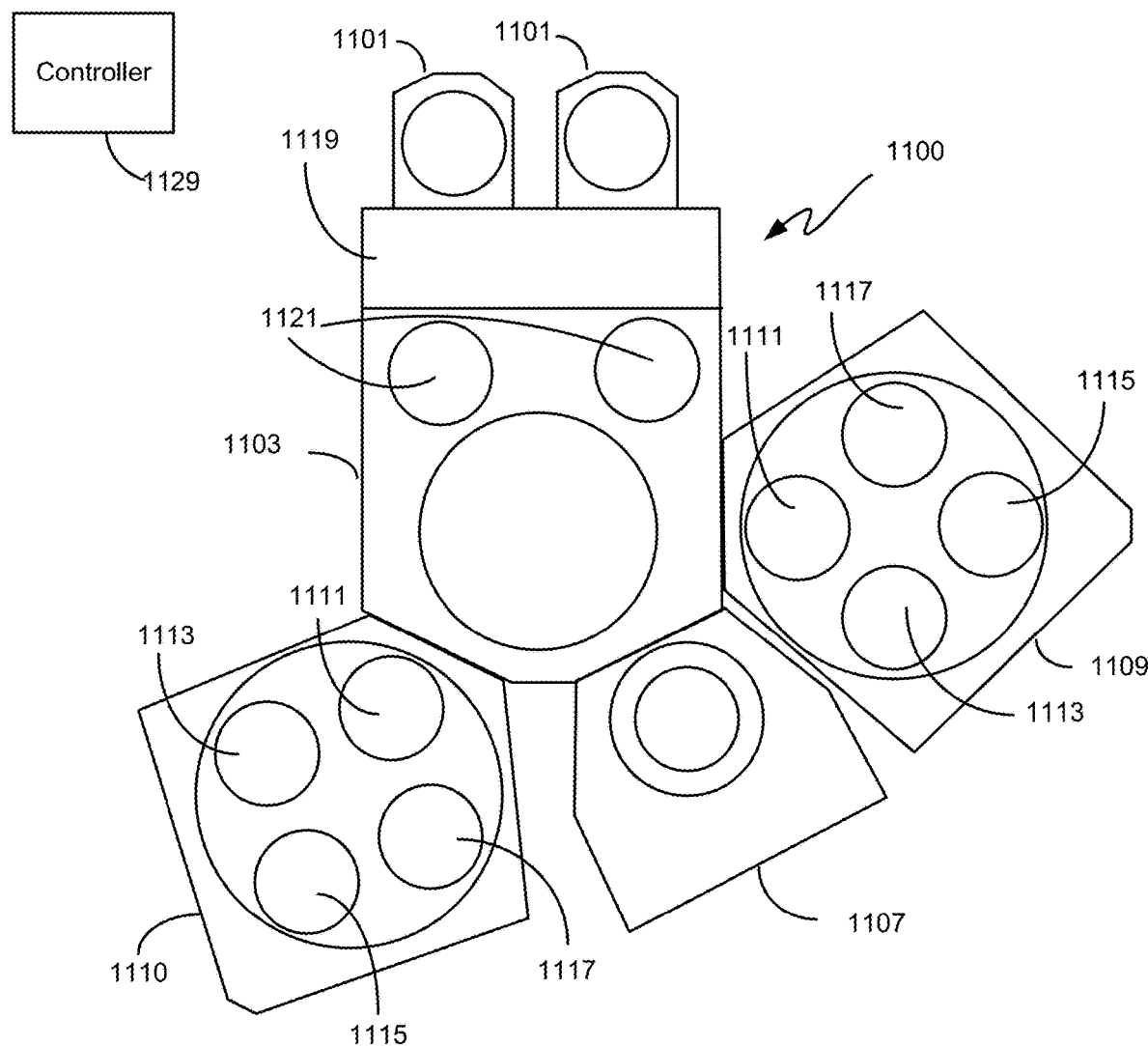
FIG. 11 is a block diagram of a processing tool configured for depositing and post-treating thin films according to an embodiment provided herein.

FIG. 11 is a block diagram of a processing system suitable for conducting thin film deposition process in accordance with certain embodiments. The system 1100 includes a transfer module 1103. The transfer module 1103 provides a clean, pressurized environment to minimize risk of contamination of substrates being processed as they are moved between various reactor modules. Mounted on the transfer module 1103 are two multi-station reactors 1109 and 1110, each capable of performing atomic layer deposition (ALD) and/or chemical vapor deposition (CVD) according to certain embodiments. In other embodiments one reactor may contain stations configured to perform ALD and another reactor may include stations configured to perform etching. Reactors 1109 and 1110 may include multiple stations 1111, 1113, 1115, and 1117 that may sequentially or non-sequentially perform operations in accordance with disclosed embodiments. The stations may include a heated pedestal or substrate support, and one or more gas inlets or showerhead or dispersion plate.

Also mounted on the transfer module 1103 may be one or more single or multi-station modules 1107 capable of performing plasma or chemical (non-plasma) pre-cleans, or any other processes described in relation to the disclosed methods. The module 1107 may in some cases be used for various treatments to, for example, prepare a substrate for a deposition process. The module 1107 may also be designed/configured to perform various other processes such as etching or polishing. The system 1100 also includes one or more wafer source modules 1101, where wafers are stored before and after processing. An atmospheric robot (not shown) in the atmospheric transfer chamber 1119 may first remove wafers from the source modules 1101 to loadlocks 1121. A wafer transfer device (generally a robot arm unit) in the transfer module 1103 moves the wafers from loadlocks 1121 to and among the modules mounted on the transfer module 1103.

In various embodiments, a system controller 1129 is employed to control process conditions during deposition. The controller 1129 will typically include one or more memory devices and one or more processors. A processor may include a CPU or computer, analog and/or digital input/output connections, stepper motor controller boards, etc.

The controller 1129 may control all of the activities of the deposition apparatus. The system controller 1129 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1129 may be employed in some embodiments.

Typically there will be a user interface associated with the controller 1129. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 1129. The signals for controlling the process are output on the analog and digital output connections of the deposition apparatus 1100.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 1129 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1129, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:

1. A method of processing a semiconductor substrate, the method comprising:
   (a) providing a semiconductor substrate comprising an exposed $SnO_2$ layer and a layer of a silicon-containing material, wherein the layer of the silicon-containing material comprises an exposed portion, and a non-exposed portion, wherein the exposed $SnO_2$ layer is over and in direct contact with the non-exposed portion of the layer of the silicon-containing material, and wherein the silicon-containing material in the exposed portion of the layer of the silicon-containing material is the same as in the non-exposed portion of the layer of the silicon-containing material; and
   (b) etching the exposed portion of the layer of the silicon-containing material in a presence of the exposed $SnO_2$ layer using an etch chemistry selected such that a ratio of an etch rate of the silicon-containing material to an etch rate of $SnO_2$ is greater than 1, wherein the etching exposes an underlying layer having a different composition from a composition of the exposed portion of the layer of the silicon-containing material.

2. The method of claim 1, wherein the exposed $SnO_2$ layer comprises a plurality of $SnO_2$ spacers.

3. The method of claim 1, wherein the exposed $SnO_2$ layer comprises a plurality of $SnO_2$ spacers residing over the non-exposed portion of the layer of the silicon-containing material.

4. The method of claim 1, wherein the layer of the silicon-containing material comprises a silicon-containing compound selected from the group consisting of silicon nitride, silicon oxide and combinations thereof.

5. The method of claim 1, wherein the layer of the silicon-containing material comprises silicon oxide.

6. The method of claim 1, wherein the layer of the silicon-containing material comprises silicon nitride.

7. The method of claim 1, wherein (b) comprises etching the silicon-containing material using a fluorocarbon plasma etch chemistry.

8. The method of claim 1, wherein the exposed $SnO_2$ layer comprises a plurality of $SnO_2$ spacers, wherein distance between adjacent spacers is between about 5 and 90 nm.

9. The method of claim 1, wherein the exposed $SnO_2$ layer comprises a plurality of $SnO_2$ spacers, having widths of between about 5 and 30 nm.

10. The method of claim 1, wherein the etch chemistry in (b) is selected such that a ratio of an etch rate of the silicon-containing material to an etch rate of $SnO_2$ is greater than 1.5.

11. The method of claim 1, wherein the etch chemistry in (b) is selected such that a ratio of an etch rate of the silicon-containing material to an etch rate of $SnO_2$ is greater than 2.

12. The method of claim 1, wherein the layer of the silicon-containing material comprises silicon oxide, and wherein in (b) the silicon oxide is etched using fluorocarbon plasma such that a ratio of an etch rate of the silicon oxide to an etch rate of $SnO_2$ is greater than 1.5.

13. The method of claim 1, wherein (b) comprises completely removing the exposed portion of the layer of the silicon-containing material without fully removing the exposed $SnO_2$ layer.

14. The method of claim 1, further comprising etching and removing mandrels to form tin oxide spacers prior to (a).

15. The method of claim 1, wherein the underlying layer exposed in (b) is a metal nitride layer.

16. The method of claim 1, wherein the underlying layer exposed in (b) is a titanium nitride layer.

17. The method of claim 1, further comprising removing the exposed $SnO_2$ layer after (b).

18. The method of claim 1, further comprising after (b): etching the underlying layer that was exposed by etching in (b) and removing the exposed $SnO_2$ layer without fully removing the exposed portion of the layer of the silicon-containing material.

* * * * *

UNITED STATES PATENT AND TRADEMARK OFFICE
CERTIFICATE OF CORRECTION

PATENT NO. : 11,031,245 B2  
APPLICATION NO. : 15/713377  
DATED : June 8, 2021  
INVENTOR(S) : David Charles Smith et al.

Page 1 of 1

It is certified that error appears in the above-identified patent and that said Letters Patent is hereby corrected as shown below:

On the Title Page

Item (73) Assignee, "Lan Research Corporation" should read --Lam Research Corporation--.

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*